United States Patent [19]

Chen et al.

[11] Patent Number: 5,206,544
[45] Date of Patent: Apr. 27, 1993

[54] CMOS OFF-CHIP DRIVER WITH REDUCED SIGNAL SWING AND REDUCED POWER SUPPLY DISTURBANCE

[75] Inventors: Chih-Liang Chen, Briarcliff; Robert H. Dennard, Peekskill; Hussein I. Hanafi, Goldens Bridge, all of N.Y.

[73] Assignee: International Business Machines Corporation, Armonk, N.Y.

[21] Appl. No.: 682,753

[22] Filed: Apr. 8, 1991

[51] Int. Cl.$^5$ .................................... H03K 17/16
[52] U.S. Cl. .............................. 307/443; 307/451; 307/453
[58] Field of Search ............... 307/443, 451, 453, 475, 307/350, 351

[56] References Cited

U.S. PATENT DOCUMENTS

| | | | |
|---|---|---|---|
| 4,140,930 | 2/1979 | Tanaka | 307/362 |
| 4,322,639 | 3/1982 | Yamashiro | 307/350 |
| 4,354,151 | 10/1982 | Dingwall | 323/225 |
| 4,654,548 | 3/1987 | Tanizawa et al. | 307/450 |
| 4,703,201 | 10/1987 | McGrail | 307/451 |
| 4,785,201 | 11/1988 | Martinez | 307/443 |
| 4,883,979 | 11/1989 | Tran | 307/475 |
| 5,043,604 | 8/1991 | Komaki | 307/475 |

Primary Examiner—Eugene R. LaRoche
Assistant Examiner—R. A. Ratliff
Attorney, Agent, or Firm—Scully, Scott, Murphy & Presser

[57] ABSTRACT

An off-chip driver circuit which includes a complementary pair of field effect transistor source followers connected in a non-inverting series circuit arrangement. The driver circuit includes an n-channel device to pull the output up to the positive supply less the threshold drop across the device and a p-channel device to pull the output down for the opposite transition to within a threshold voltage drop above ground of the p-channel device. The driver circuit includes means for eliminating body effect by connecting the n(p)-well of the p(n) channel transistor to the output node. The driver circuit provides a reduced swing low noise output which reduces the collapse of the power supply. The driver circuit provides an appropriate impedance match to the output transmission line, so that the output transmission line can be terminated to eliminate reflections.

18 Claims, 4 Drawing Sheets

CMOS OFF-CHIP DRIVER WITH REDUCED SIGNAL SWING AND REDUCED POWER SUPPLY DISTURBANCE

BACKGROUND OF THE INVENTION

1. Field of the Invention

The present invention relates generally to integrated circuit devices, and more particularly, to a CMOS off-chip driver circuit with reduced signal swing, reduced power supply disturbance and no body effect.

2. Description of the Prior Art

Multi-chip packaging technology is desirable for realizing high performance and highly integrated systems. In this technology, a substrate that provides chip-to-chip wiring offers shorter interconnection lengths and reduced parasitics compared to single-chip module packages. Chip-to-chip interconnection delay, which often limits system performance, can then be minimized. On the other hand, the number of off-chip drivers (OCDs) increases with increasing the level of integration. Therefore, the noise generated by these drivers becomes a crucial concern especially when many of them switch simultaneously. This noise is known as a simultaneous switching noise (di/dt noise) and results from rapid current change across a parasitic inductance of the power supply bus. This noise can create a false signal and cause spurious switching.

The delay associated with sending signals from chip-to-chip is the longest delay in computers and other devices that require chip-to-chip interconnection. Some of this delay is inherent to the transmission line including effects such as signal reflection (also called ringing). An off-chip driver is used to minimize this delay by generating a large current very quickly to charge the transmission line very rapidly to a new state. However, by doing so, the rate of change of current with respect to time (di/dt) is very high. With multi-chip packaging technology, there are a large number of off-chip drivers switching simultaneously. This results in a large simultaneous switching noise (Ldi/dt), where L is the parasitic inductance of the power bus. An off-chip driver which resides on the noisy supplies of a sending chip can transmit this noise into a signal line feeding an off-chip receiver (OCR), causing a false signal and spurious switching. Thus, there is a need to develop an OCD with reduced simultaneous switching noise.

In addition, simultaneous switching noise, (Ldi/dt), results in a relative collapse of the power supply and causes performance degradation because the circuits are operating transiently at a lower supply voltage than intended. The value of the inductance, L, has restrictions and is set by chip packaging. In order to minimize the power supply collapse, it is desirable to reduce the simultaneous switching noise. Thus, there is a further need to develop an OCD with reduced simultaneous switching noise.

Another cause of the delay in sending signals from chip-to-chip is due to transmission line reflection. Signal reflection is an important issue in the design of a signal driver, especially in the case of very high frequency signal transmission using longer interconnection lines. In a conventional full swing driver/receiver design, excessive transmission line ringing occurs because the output impedance of the OCD is not matched to the transmission line characteristic impedance. If this extraneous ringing crosses the threshold of an off-chip receiver (OCR), double switching may occur. For this reason a delay adder must be used to allow an adequate settling time before a receiver level is assumed valid. The settling time is dependent on both the net length and loading configuration. Thus, there is a need to develop an OCD with an output impedance that matches the transmission line characteristic impedance.

Another problem related to circuits which use an n-channel over p-channel totem pole configuration wherein the output is taken from the common source node is the body effect. The source to substrate voltage varies and therefore, the threshold changes with output voltage, thereby degrading the performance of such a circuit arrangement. Thus, there is a need to develop an n-channel over p-channel circuit which eliminates the body effect.

SUMMARY OF THE INVENTION

The present invention is directed to an improved OCD circuit which utilizes a reduced output voltage swing to minimize the OCD output noise. The present OCD, unlike the conventional OCD, consists of two source followers arranged in an n-channel over p-channel totem pole configuration. The driver output is taken from the common source node. In one embodiment of the present invention, an input signal which swings between a positive power supply voltage and ground is applied to the gates of both transistors. The n-channel transistor is used to pull the output up to the positive supply voltage less the threshold drop across the n-channel transistor and the p-channel device is used to pull the output down for the opposite transition to within a voltage threshold drop above ground thereby resulting in a reduced output swing. Since the noise induced on the power supply and ground is proportional to the voltage swing, the OCD circuit of the present invention results in a reduction of such noise. In addition, the OCD circuit of the present invention controls the rise and fall time of the output signal which further helps in reducing power supply collapse.

Since the present OCD circuit is connected in an n-channel over p-channel totem pole configuration and the output is taken from the common source node, these transistors will include body effect. The present invention eliminates the body effect of either or both transistors by connecting the n-well of the p-channel device and/or the p-well of the n-channel device to the output node.

The n-channel over p-channel configuration of the present OCD is also used to match the impedance of the output of the OCD to the characteristic impedance of a transmission line. The output impedance of either complementary metal oxide semiconductor (CMOS) transistor while turned on is given approximately by $1/g_m$. The output impedance of the OCD is matched to the characteristic impedance of the transmission line by adjusting each source follower transistor size (W/L) to obtain the appropriate value for $g_m$. Thus, the OCD of the present invention allows the output transmission line to be terminated at the driver end to eliminate multiple reflections on the line.

In another embodiment of the present invention, which includes all of the above advantages of the first embodiment, a pre-driver circuit is used in connection with the above OCD. The ramp rate for the output current of this embodiment, which determines the power supply noise, follows the rise (fall) time of the input waveform. To minimize the di/dt of this driver, a linear rise (fall) of its input signal is obtained by driving the input capacitance of the driver from a constant current source. A pre-driver circuit is implemented which provides a constant current pre-driver output. This pre-driver circuit allows the driver to operate in saturation, unlike conventional drivers which operate in a linear mode. This, combined with the source follower configuration of the driver results in an OCD output current which minimizes noise generated on the power supply, by minimizing di/dt for a given speed.

The pre-driver circuit includes an input inverter which acts as a buffer and provides an output waveform having a fast rate of change of voltage. A pair of current mirror circuits are connected between the output of the inverter and the two gates of the driver circuit, respectively. The current mirror circuits provide constant current inputs to the respective gates of the driver. The current mirror circuits also provide waveforms having a rate of change of voltage less than the rate of change of the waveform applied to the inverter. The circuits are also designed such that the onset of each of the generated waveforms occur at a voltage level sufficient to turn the corresponding OCD driver device off. In addition, the current mirror circuits slow down the rate at which the output will rise and fall such that the delay needed for the reduced swing output to rise and fall will be equal to the delay time required for the input signal to rise and fall. Thus, a reduced noise is achieved for the same delay time. The pre-driver circuit also sets the proper off levels for the driver n and p-channel transistors for tri-state operation.

Another important feature of this improved OCD is that the output voltage level follows the input signal on the active (turned-on) OCD transistor, and is relatively independent of the voltage of the power supply connected to the drain of that transistor. The noise produced by a change of current di/dt in one of the OCD transistors appears on the power supply or ground lines connected to the drains of the two output transistors since the current flows through those lines and through whatever parasitic inductance is in series with those lines in the off-chip circuit loop driven by the OCD. Thus, when the input signal of the OCD is derived from a separate power supply system which has less noise (a "quiet" power supply), then the output level of the OCD is relatively independent of the noise induced by the OCD switching as long as the drain voltage on each of the OCD transistors is within the limits for which these transistors still operate in a source-follower mode. To complete the transmission of data from one chip to another, a "quiet" power supply system should also be used for the off-chip receiver (OCR) circuit so that the detection threshold levels of that circuit are also unaffected by noise caused by any OCD drivers which may be switching on that chip.

DETAILED DESCRIPTION OF THE INVENTION

Figure 1:
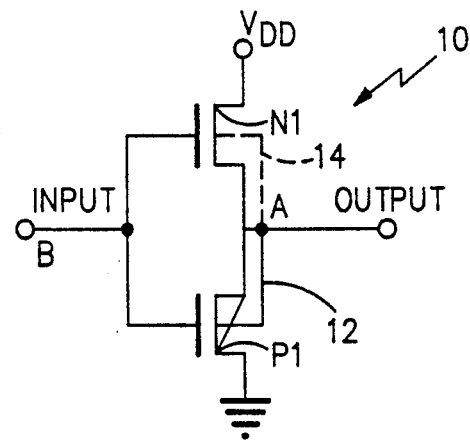
FIG. 1 is a schematic diagram of an OCD circuit which utilizes a reduced output voltage swing in accordance with the present invention.

FIG. 1 is a schematic diagram of an OCD 10 of the present invention which utilizes a reduced output voltage swing. The OCD 10 includes a complementary pair of field effect transistors (FETs), consisting of an n-channel transistor N1 and a p-channel transistor P1. In contrast with a conventional OCD in CMOS technology, the transistors N1 and P1 of OCD 10 are connected in a non-inverting n-channel over p-channel totem pole configuration and operate as source followers. More specifically, the sources of transistors N1 and P1 are connected to each other and to output node A. The drain of transistor N1 is connected to a power supply voltage $V_{DD}$. The drain of P1 is connected to ground potential. The gates of transistors P1 and N1 are connected to the input node B. The two voltage levels, $V_{DD}$ and ground, are used to illustrate the operation of OCD 10. However, the scope of the present invention includes any two voltage levels which can be used in the operation of OCD 10 where $V_{DD}$ is an example of a first voltage potential and ground is an example of a second voltage potential which is at a lower voltage than said first voltage potential.

The use of an n-channel over p-channel configuration results in an undesirable body effect because the sources of transistors N1 and P1 are connected to the output node. However, by connecting the n-well of P1 and/or the p-well of N1 to the output node as shown by connections 12 and 14, respectively, the body effect of transistors P1 and/or N1 is eliminated.

Since transistors N1 and P1 are connected in a source follower configuration, the voltage at the sources of these transistors, which is also the output, will follow the voltage at the gates of transistors N1 and P1 minus the threshold voltage of transistors N1 and P1 respectively. When the input is at a low input voltage level, for example zero volts, transistor P1 is on and transistor N1 is off. Thus, the output voltage will equal the threshold voltage of transistor P1 ($V_{TP1}$) As the input voltage rises, transistor P1 will turn off, and transistor N1 will begin to turn on when the input voltage crosses $|V_{TP1}|+V_{TN1}$. As the input rises further, the output will follow the input until the input is one threshold drop less than the peak value of the input voltage, which is typically $V_{DD}$. Thus, transistor N1 is used to pull the output up to the voltage $V_{DD}$ less the threshold voltage dro $V_{TN1}$ across transistor N1, and transistor P1 is used to pull the output down for the opposite transition to a level $|V_{TP1}|$ above ground. Thus, for an input voltage swing of 2.5 volts and a $V_{TN1}$ of 0.6V and $V_{TP1}$ of $-0.6$V, the output of OCD 10 only swings between 0.6 volts and 1.9 volts, a reduction of nearly a factor of 2. Reducing the output voltage swing reduces the current which is needed to drive any kind of output load in a given time. Therefore, di/dt is reduced and hence, the simultaneous switching noise is diminished.

Thus, one advantage of using an OCD with reduced swing low noise output is that it minimizes the power supply collapse. The collapse of the power supply is equal to the parasitic inductance of the power supply (L) multiplied by the rate of change of current with respect to time (di/dt). The value of L has design restrictions imposed on it and cannot be lowered. Thus, to minimize the power supply collapse, it is desired to reduce di/dt. As discussed above, the OCD 10 achieves a reduction in di/dt thereby minimizing the collapse of the power supply.

Another advantage of OCD 10, by implementing an n-channel over p-channel source follower configuration, is that the output impedance of OCD 10 can be designed to match the characteristic impedance of a transmission line thereby eliminating signal reflection which is present in conventional full swing OCDs. The output impedance of the source follower is $1/g_m$, which is nearly constant for the n-channel device N1 over a wide range of input and output voltages due to saturation velocity effects. The p-channel device P1 is not as ideal but still has reasonably constant output impedance. By adjusting the transistor size (W/L) of N1 and P1 and choosing a value for $g_m$ such that $Ro=1/g_m$, where Ro is the characteristic impedance of the transmission line, the OCD 10 suppresses signal ringing on the transmission line.

In another embodiment of the present invention, a pre-driver circuit is implemented which reduces the simultaneous switching noise by controlling the ramp rate of the output current. It also results in a reduced swing OCD output that is not affected by the noise generated on the driver circuit power supply. This is achieved because the pre-driver circuit power supply is separated from the reduced swing driver power supply. The output from the pre-driver, which is largely noise free, controls the output levels of the reduced swing driver which are independent of noise on the reduced swing driver's power supply due to the source follower configuration.

Figure 2:
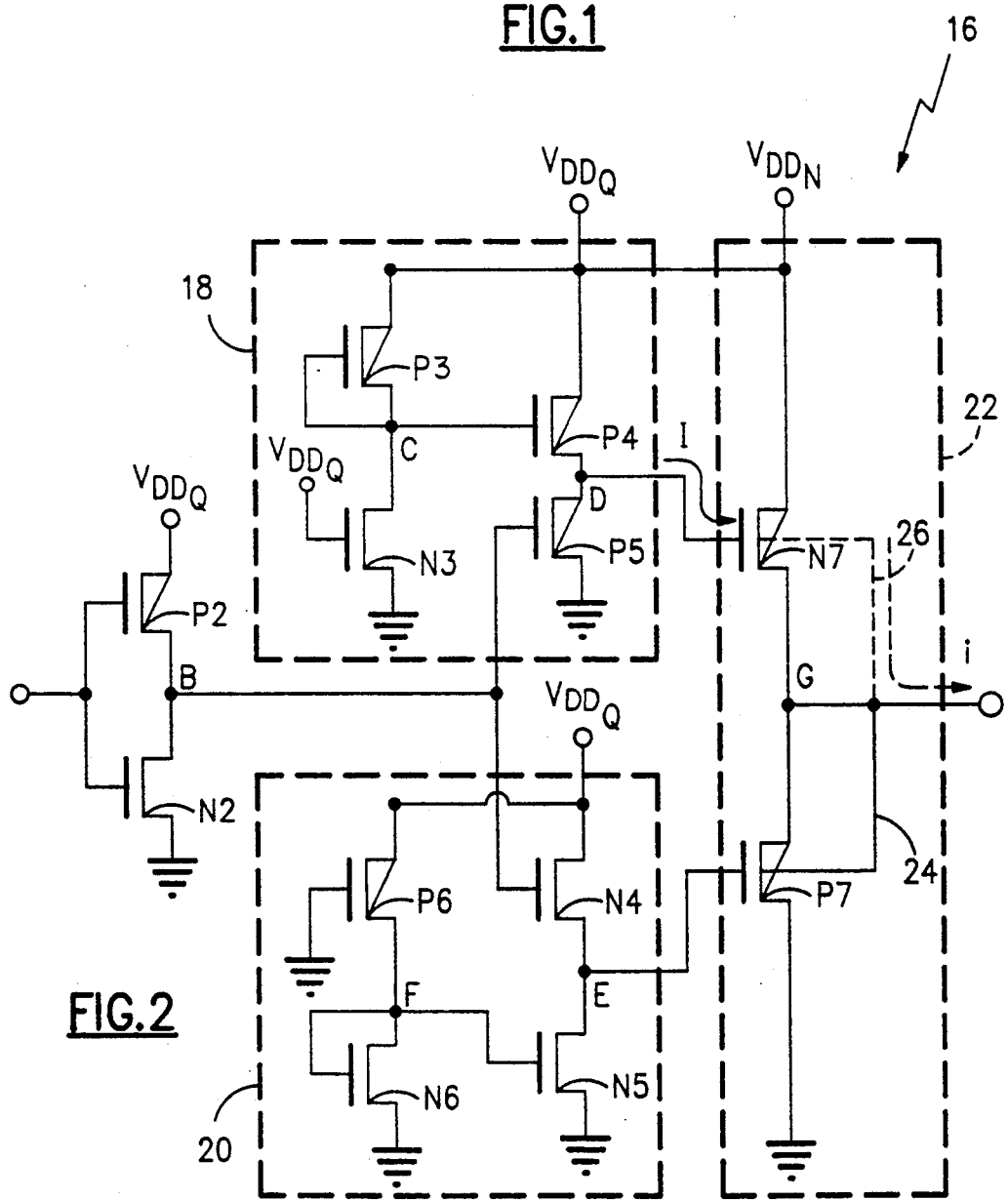
FIG. 2 is a schematic diagram of an OCD circuit which utilizes a constant current pre-driver circuit and reduced output voltage swing in accordance with the present invention.
Figure 3:
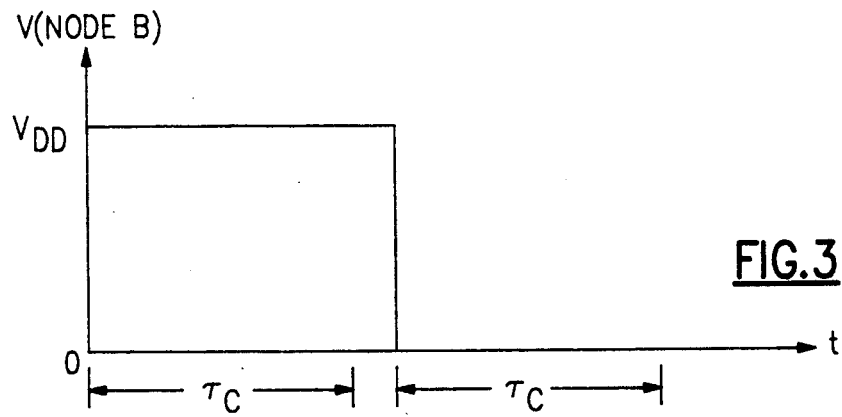
FIG. 3 is a drawing of the voltage at node B of the OCD in FIG. 2 when the input rises from a low input voltage to a high input voltage and then falls back to the low input voltage.
Figure 4:
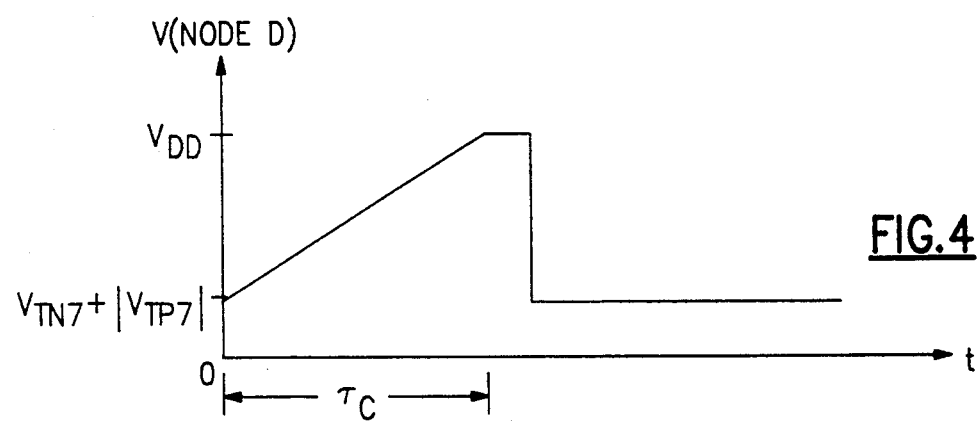
FIG. 4 is a drawing of the voltage at node D of the OCD in FIG. 2 when the input signal rises from a low input voltage to a high input voltage and then falls back to the low input voltage.
Figure 5:
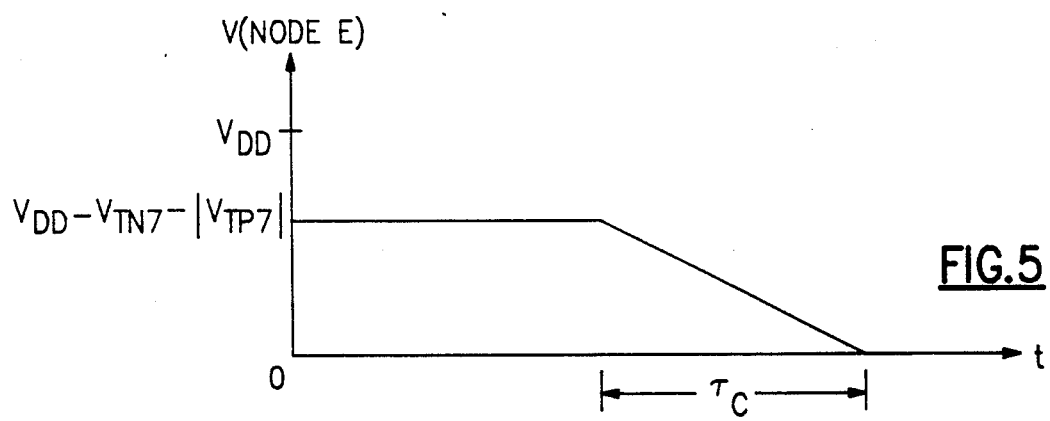
FIG. 5 is a drawing of the voltage at node E of the OCD in FIG. 2 when the input signal rises from a low input voltage to a high input voltage and then falls back to the low input voltage.
Figure 6:
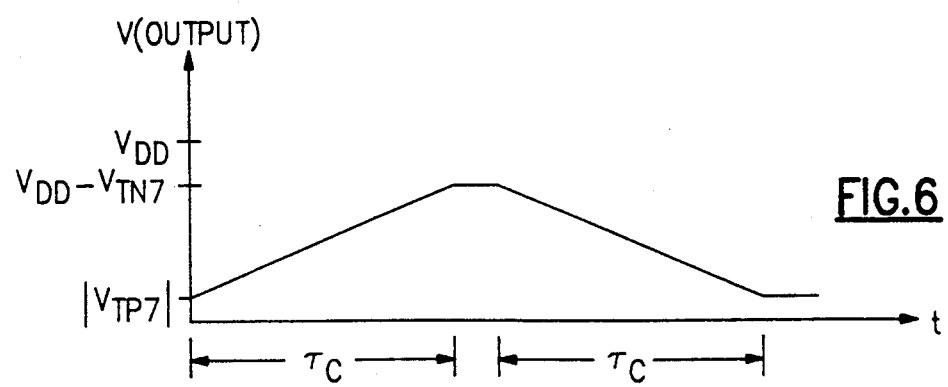
FIG. 6 is a drawing of the output voltage at node G of the OCD in FIG. 2 when the input signal rises from a low input voltage to a high input voltage and then falls back to the low input voltage.

FIG. 2 is a schematic diagram of an OCD 16 which incorporates a constant current pre-driver circuit which comprises current mirror circuits 18 and 20. The OCD 16 includes an input CMOS inverter comprised of n-channel transistor N2 and p-channel transistor P2 arranged in an inverting p-channel over n-channel totem pole configuration. The drains of transistors P2 and N2 are connected together at a node B. The source of transistor P2 is connected to a positive voltage $V_{DDQ}$, which is a power supply having the same nominal voltage $V_{DD}$ but having a relatively "quiet" or diminished noise level by virtue of being wired through a separate path to the power source from the path used to wire the output drivers to the power source, and the source of transistor N2 is connected to a ground potential. The input signal is applied to the gates of transistors P2 and N2. OCD 16 further includes a pair of current mirror circuits 18 and 20 connected between the output of the input inverter and the gates of the driver circuit 22. Current mirror circuit 18 includes three p-channel transistors P3, P4 and P5 and one n-channel transistor N3. The sources of transistors P3 and P4 are connected to $V_{DDQ}$. The gates of transistors P3 and P4 are connected together at a node C. The drains of transistors P3 and N3 are also connected together at node C. The gate of transistor N3 is connected to $V_{DDQ}$ and the source of transistor N3 is connected to ground. The drain of transistor P4 is connected to the source of transistor P5 at a node D. The gate of transistor P5 is tied to the output of the input inverter at node B and the drain of transistor P5 is connected to ground. Current mirror circuit 20 includes three n-channel devices N4, N5 and N6 and one p-channel device P6. The drain of transistor N4 and the source of transistor P6 are connected to $V_{DDQ}$. The gate of transistor N4 is tied to node B and the gate of transistor P6 is connected to ground. The source of transistor N4 is connected to the drain of transistor N5 at a node E. The gate of transistor N5 and the drains of transistor N6 and P6 are tied to each other at a node F. The drain of transistor N6 is connected to the gate of transistor N6. The sources of transistors N5 and N6 are tied to ground. OCD 16 includes driver circuit 22 which includes an n-channel transistor N7 and p-channel transistor P7 arranged in an n-channel over p-channel totem pole configuration. The output of current mirror circuit 18 is applied to the gate of transistor N7 and the output of current mirror circuit 20 is applied to the gate of transistor P7. The sources of transistors N7 and P7 are tied to each other at an output node G. The drain of transistor N7 is connected to $V_{DDN}$, which can be a relatively "noisy" power supply, and the drain of transistor P7 is connected to ground. The n-well of transistor P7 and/or the p-well of N7 is connected to node G as shown by connections 24 and 26, respectively, to eliminate the body effect of transistors P7 and/or N7. The voltage levels $V_{DDN}$, $V_{DDQ}$ and ground are used to illustrate the operation of OCD 16. However, the scope of the present invention includes any two voltage levels which can be used in the operation of OCD 16 where $V_{DDQ}$ and $V_{DDN}$ are examples of a first voltage potential and ground is an example of a second voltage potential which is at a lower voltage than said first voltage potential.

There are two considerations in reducing the simultaneous switching noise of OCD 16. First, it is desirable to reduce the simultaneous switching noise of the output of OCD 16 for the same chip-to-chip delay time as in conventional full swing OCDs. Second, it is desirable that the current I flowing into transistor N7 varies linearly with time as the voltage at the source of transistor N7 rises toward its final value. This condition gives the smallest di/dt design, i.e., di/dt is constant.

It will be understood by those skilled in the art of the present invention that the operation of the output of OCD 16 during its fall from a high output voltage to a low output voltage will be symmetrically opposite to its operation during a rise from a low output voltage to a high output voltage. In addition, it will be understood that the operation of transistor P7 and current mirror circuit 20 will be the symmetric complement of the operation of transistor N7 and current mirror circuit 18, respectively. Thus, in the discussion to follow, the operation of OCD 16 will only be described with reference to the rise of the output, current mirror circuit 18 and n-channel transistor N7.

It is desired to have a step input signal to the pre-driver circuits (node B) which will rise from zero volts to $V_{DD}$ in essentially zero time as compared with the time it takes for the output at node G to rise from a low output voltage to a high output voltage. The latter has a controlled rise time $\tau_c$ determined by the parameters of pre-driver circuit 18. When the voltage at node B is zero volts, transistor N7 is off and transistor P7 is on. Thus, the output voltage will be equal to the magnitude of the threshold voltage of transistor P7, $|V_{TP7}|$. Transistors P4 and P5 are used to keep the voltage at node D just below the turn-on voltage of transistor N7 which is approximately $V_{TN7}+|V_{TP7}|$. When the signal at node B rises from zero volts to $V_{DD}$, in essentially zero time, the voltage at node D will begin to rise from $V_{TN7}+|V_{TP7}|$ to $V_{DD}$ with a controlled rise time. The output node, node G, will also rise from $|V_{TP7}|$ to $V_{DD}-V_{TN7}$ in essentially the same time. In addition, during this rise, the voltage at node E will rise from zero volts to $V_{DD}-|V_{TP7}|-V_{TN7}$ turning device P7 off and keeping it turned off.

The relationship between the voltages at nodes B, D and E and output node G are shown in FIGS. 3 to 6. From these figures it can be seen that the output rise-time of OCD 16 is controlled by the risetime of the signal on node D.

The current i out of output node G into a resistive load is proportional to the gate-to-source voltage of transistor N7. Thus, $$\frac{di}{dt} \alpha \frac{dV}{dt} GN7 = \frac{I}{C_{N7}}$$

where I is the current flowing into the gate of transistor N7 and $C_{N7}$ is the effective input capacitance of transistor N7. Since the capacitance of N7 is nearly constant after N7 turns on, it is desired that I be constant over a wide range of the drain-to-source voltage of P4 ($V_{DSP4}$) to obtain a constant di/dt. The common signal to transistors P3 and P4 adjusts itself to make the current through these devices proportional to the reference current in transistor N3. The desired reference current is determined by the dimensions of transistor N3 which are chosen large enough to be insensitive to lithography. The reference current is reproduced in transistor P4 and flows into transistor P5 when transistor N7 is off. When the signal at the gate of transistor P5 turns off transistor P5 then the mirrored reference current in transistor P4 flows into the gate of transistor N7. The voltage at the gate of transistor N7 then rises at a rate determined by the reference current and the gate capacitance. The current through transistor P4 will be constant over a wide range of $V_{DSP4}$ because the dimensions (W/L) of transistors P3 and P4 are chosen such that the magnitude of the drive voltage on the gates of transistors P3 and P4 will stabilize at a value just above $|V_{TP4}|$. It is also required that the channel lengths of transistor P3 and transistor P4 be the same in order for transistor P3 and transistor P4 to have identical threshold voltages. Thus, transistor P4 will be operating in the saturation mode, thereby providing a wide range of $V_{DSP4}$ over which I will be constant. Transistor P5 is used to set the voltage at node D just below the turn-on voltage of transistor N7 prior to turning it on.

It will be understood by those skilled in the art that OCD 16 can readily be made to operate in a tri-state mode by applying separate input signals to current mirror circuits 18 and 20 so that both output transistors N7 and P7 can be turned off simultaneously. These separate input signals applied at the gates of P5 and N4, respectively, will both be the same during the normal operation of OCD 16 described above, but will be made ground on the gate of P5 and $V_{DD}$ on the gate of N4 to turn off both output transistors of OCD 16. It will further be understood that the same principles used in separating the power supply line $V_{DDN}$ and $V_{DDQ}$ in OCD 16 may also be used for the ground lines. Thus, the ground connection of driver circuit 22 will be provided through a separate path to the system ground.

Several requirements have to be met by a receiver to work with the reduced-swing driver. It must detect reduced input voltage swing, reject noise and have a full swing (0 volts to $V_{DD}$) digital output. A simple CMOS inverter can provide this function if the tolerances and noise are adequately controlled. The reduced swing will cause one or the other of the inverter devices to conduct current, but this is not harmful. For nominal conditions and no noise, this circuit will switch its output state if the input signal swings more than halfway for a sufficient time.

Figure 7:
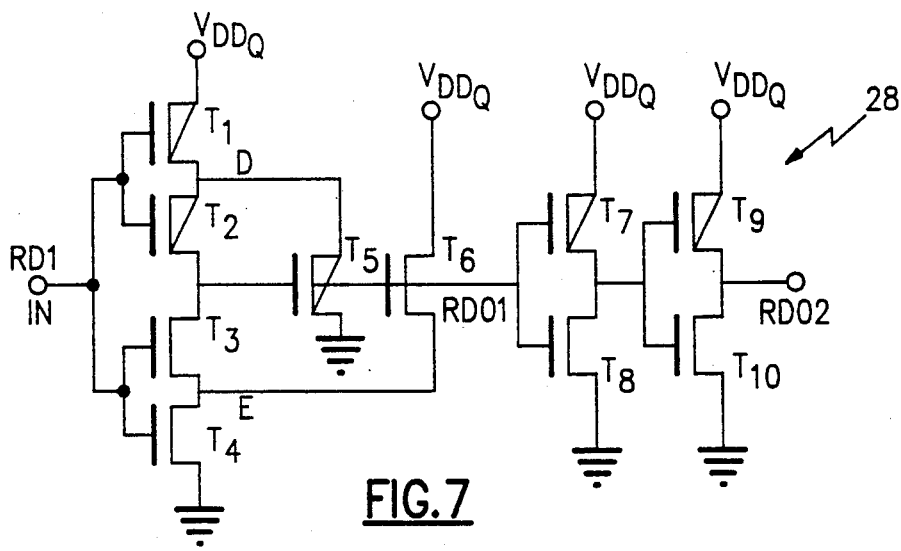
FIG. 7 is a schematic diagram of a receiver circuit which can be used to detect the binary signal transmitted by the reduced swing OCD circuit of FIG. 2.

An alternative is to provide an off-chip receiver (OCR) with some amount of hysteresis in the transfer characteristics. Compared to the simple inverter, which has no hysteresis, this circuit will switch its output state only if the input signal from the line swings some amount greater than halfway for a period of time. Such a circuit is shown in FIG. 7. OCR circuit 28 includes 5 p-channel transistors $T_1$, $T_2$, $T_5$, $T_7$ and $T_9$ and 5 n-channel transistors $T_3$, $T_4$, $T_6$, $T_8$ and $T_{10}$. With the input at a given level (e.g. "high" at 1.9V) the output of the first stage has the opposite polarity (e.g., "low" at 0 volts). This output turns on one or the other of the receiver devices $T_5$ or $T_6$ (e.g., $T_5$) which tends to prevent switching to the opposite state by providing a feedback path (e.g., $T_1$, $T_5$ to adjust the source voltage on either $T_2$ or $T_3$ (e.g., $T_2$ in this case) to assure it stays in the off condition unaffected by noise on the input line. Proper choice of the device widths will allow the circuit to switch at the desired input signal level (e.g., at about 1V in this case). This circuit turns off the leakage current through the central inverter in the stack of input devices ($T_2$ and $T_3$) but does draw some d-c current through the feedback devices, and therefore consumes a small amount of d-c power. FIG. 7 shows the OCR circuits connected to a power supply $V_{DDQ}$ which is relatively noise free. This is desirable because of the smaller signal swing being detected.

Figure 8:
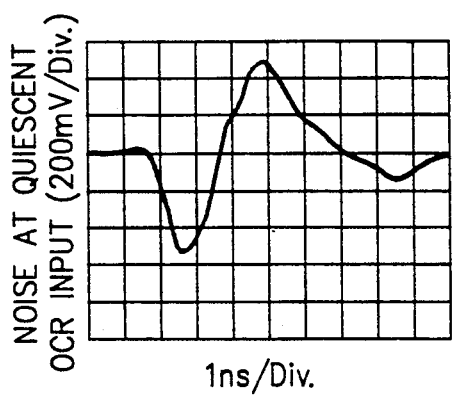
FIGS. 8 and 9 are photographs of noise measurements for 40 simultaneous switching conventional full swing OCDs with outputs switching from a high to a low logic level.
Figure 9:
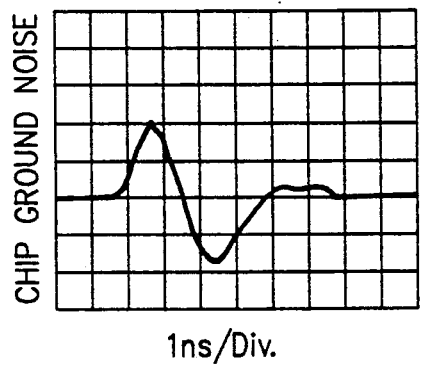

FIGS. 8 and 9 show the actual di/dt noise measurements for 40 simultaneous switching conventional full swing drivers with outputs switching from a high to a low logic level.

Figure 10:
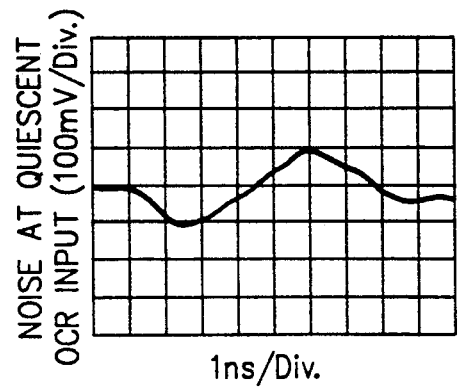
FIGS. 10 and 11 are photographs of noise measurements for 40 simultaneous switching reduced swing OCDs in accordance with the present invention.
Figure 11:
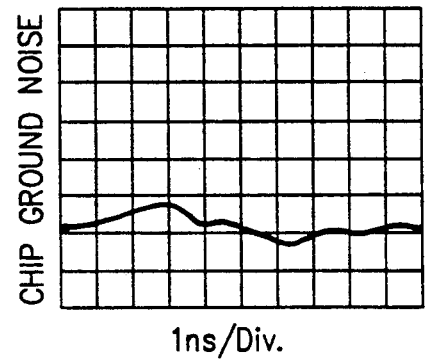

FIGS. 10 and 11 show the actual di/dt noise measurements for 40 simultaneous switching reduced swing drivers in accordance with the present invention with outputs switching from a high to a low logic level.

By comparing FIGS. 8 and 9 with FIGS. 10 and 11 it is shown that the magnitude of the quiescent receiver input noise and ground noise produced by the conventional full swing OCD is approximately 5-6 times that of the reduced swing OCD. From this data, it can be concluded that the number of OCDs which can be switched simultaneously will increase by a factor of 5-6 if the reduced OCD is used instead of the conventional full swing design. On the other hand, since the premise behind the reduced swing I/O scheme is the offset logic levels of 0.6 and 1.9 volts, the noise margin left for the OCR input is essentially cut in half from the case of 0.0 and 2.5 volt levels. Thus, the net increase in allowable simultaneous switching will more likely be in the range of 2.5-3.

Figure 12:
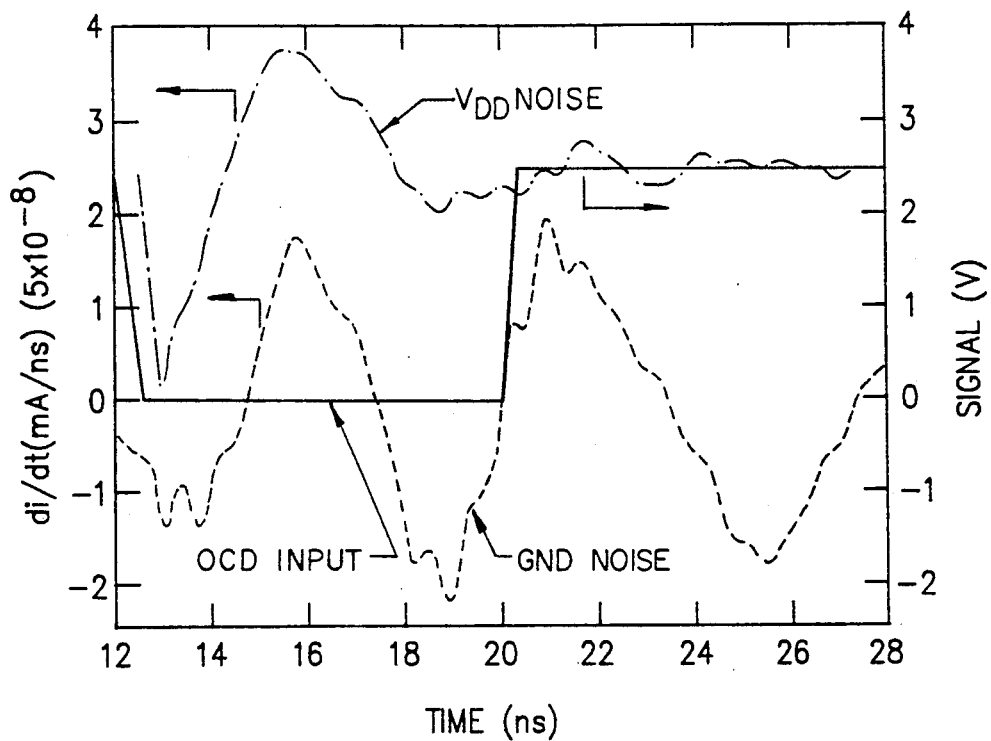
FIG. 12 is a simulated plot of the power supply VDD and ground (GND) noise for 200 simultaneously switching conventional full swing OCDs.
Figure 13:
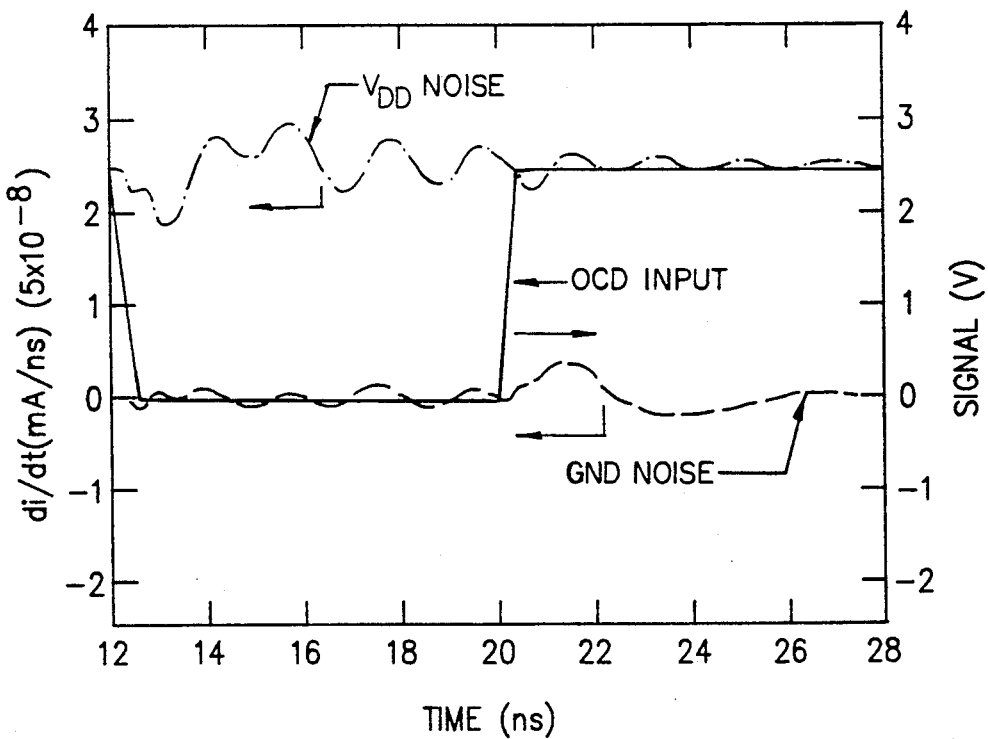
FIG. 13 is a simulated plot of the power supply VDD and ground (GND) noise for 200 simultaneous switching reduced swing OCDs in accordance with the present invention.

FIG. 12 is a simulated plot of the power supply $V_{DD}$ and ground GND noise for 200 simultaneous switching conventional full swing OCDs. FIG. 13 is a simulated plot of the $V_{DD}$ and ground noise for 200 simultaneously switching reduced swing OCDs in accordance with the present invention. As can be seen by comparing FIG. 12 to FIG. 13, the maximum di/dt noise of the reduced swing OCD is about a factor of four smaller than the conventional full swing OCD. Assuming a value of 250 pH for the effective parasitic inductance, the maximum power supply collapse for both, $V_{DD}$ and GND, is 0.5V for the reduced swing OCD versus 2.0V for the conventional full-swing OCD.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

Having thus described the invention, what is claimed as new and what is desired to be secured by Letters Patent is:

1. A driver circuit comprising:
a pair of complementary field effect transistors each having source, drain and gate terminals, the sources of each of said pair of transistors being connected in series at an output node, the drain of a first of said pair of transistors being connected to a first voltage potential and the drain of a second of said pair of transistors being connected to a second voltage potential which is at a lower voltage than said first voltage potential, the gates of each of said pair of transistor being coupled to an input node, a well of one of said pair of transistors being connected to said output node.

2. The driver circuit of claim 1 wherein said first transistor is an n-channel transistor and said second transistor is a p-channel transistor.

3. The driver circuit of claim 2 wherein the n-well of said p-channel transistor is connected to said output node.

4. The driver circuit of claim 2 wherein the p-well of said n-channel transistor is connected to said output node.

5. The driver circuit of claim 2 wherein the n-well of said p-channel transistor and the p-well of said n-channel transistor is connected to said output node.

6. The driver circuit of claim 2 wherein the transistor sizes (W/L) of both field effect transistors provide an impedance match between the node and a characteristic impedance of the transmission line.

7. A low noise driver circuit comprising:
a pair of complementary field effect transistors the sources of which are connected in series at a node, the drain of one of said pair being connected to a first voltage potential and the drain of the other of said pair being connected to a second voltage potential which is at a lower voltage than said first voltage potential, each of said field effect transistors having a gate electrode,
an output transmission line connected to said node,
an input terminal,
means connected to said input terminal for applying an input waveform having a given rate of change of voltage to said input terminal, and,
means connected between said input terminal and said gate electrodes for applying generated waveforms having a rate of change of voltage less than said given rate to said gate electrodes such that the onset of each of said generated waveforms occurs at a voltage level sufficient to turn off the transistor associated with that gate electrode providing on said output transmission line a reduced swing low noise output waveform.

8. The low noise driver circuit of claim 7 further including means for eliminating body effect.

9. The low noise driver circuit of claim 8 wherein said means for eliminating body effect comprises connecting a well of one of said pair of transistors to said node.

10. The low noise driver circuit of claim 9 wherein the one of said pair of transistor being an n-channel transistor and the other of said pair of transistors being a p-channel transistor.

11. The low noise driver circuit of claim 10 wherein the n-well of said p-channel transistor is connected to said node.

12. The low noise driver circuit of claim 10 wherein the p-well of said n-channel transistor is connected to said node.

13. The low noise driver circuit of claim 7 wherein the transistor sizes (W/L) of both field effect transistors provide an impedance match between the node and a characteristic impedance of the transmission line 14. The low noise driver circuit of claim 7 wherein said means for applying an input waveform includes a CMOS inverter circuit.

15. The low noise driver circuit of claim 13 wherein said CMOS inverter circuit comprises a pair of complementary field effect transistors, the drains of which are connected in series at a node, the source of a p-channel transistor of said pair being connected to a voltage source and the source of an n-channel transistor of said pair being connected to a reference potential, the gates of said pair being connected to said input terminal.

16. The low noise driver circuit of claim 7 wherein said means connected between said input terminal and said gate electrode comprises a pair of current-mirror circuits.

17. A low noise reduced swing driver-receiver circuit comprising:
a pair of complementary field effect transistors the sources of which are connected in series at a node, the drain of one of said pair being connected to a first voltage potential and the drain of the other of said pair being connected to a second voltage potential which is at a lower voltage than said first voltage potential, each of said field effect transistors having a gate electrode,
an output transmission line connected to said node,
an input terminal, means connected to said input terminal for applying an input waveform having a given rate of change of voltage to said input terminal, means connected between said input terminal and said gate electrodes for applying generated waveforms having a rate of change of voltage less than said given rate to said gate electrodes such that the onset of each of said generated waveforms occurs at a voltage level sufficient to turn the transistor associated with that gate electrode off providing on said output transmission line a reduced swing low noise output waveform, and a receiver circuit coupled to said node through a transmission line.

18. The low noise reduced swing driver circuit of claim 17 wherein said receiver circuit includes means for switching its output state only if the input signal from the transmission line swings an amount greater than halfway for a period of time.

* * * * *